United States Patent
Chaji et al.

(10) Patent No.: US 12,477,862 B2
(45) Date of Patent: Nov. 18, 2025

(54) CARTRIDGE INSPECTION ANCHORS

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 771 days.

(21) Appl. No.: 17/785,964

(22) PCT Filed: Dec. 18, 2020

(86) PCT No.: PCT/CA2020/051758
§ 371 (c)(1),
(2) Date: Jun. 16, 2022

(87) PCT Pub. No.: WO2021/119836
PCT Pub. Date: Jun. 24, 2021

(65) Prior Publication Data
US 2022/0416116 A1    Dec. 29, 2022

Related U.S. Application Data

(60) Provisional application No. 62/950,708, filed on Dec. 19, 2019.

(51) Int. Cl.
*H01L 33/00* (2010.01)
*H10H 20/01* (2025.01)
(52) U.S. Cl.
CPC .............................. *H10H 20/018* (2025.01)

(58) Field of Classification Search
None
See application file for complete search history.

(56) References Cited

U.S. PATENT DOCUMENTS

| | | | |
|---|---|---|---|
| 2014/0159066 A1 | 6/2014 | Hu et al. | |
| 2018/0151804 A1* | 5/2018 | Chaji | G01R 31/2635 |
| 2018/0286734 A1 | 10/2018 | Meitl et al. | |

FOREIGN PATENT DOCUMENTS

| | | |
|---|---|---|
| CN | 110036492 A | 7/2019 |
| WO | 2015193435 A1 | 12/2015 |
| WO | 2018096455 A1 | 5/2018 |

OTHER PUBLICATIONS

PCT International Search Report and Written Opinion relating to PCT application No. PCT/CA2020/051758, dated Dec. 18, 2020.
KIPO: KR Office Action relating to KR application No. 10-2022-7020560, dated May 2, 2025.
PRC (China): CN Office Action relating to CN application No. 202080086250.5, dated May 28, 2025.

* cited by examiner

*Primary Examiner* — Bradley Smith

(57) ABSTRACT

The present disclosure deals with a method of integrating microdevices on a backplane using bonded pads. The process has a substrate having microdevices with bonding of selective microdevices through connecting pads on the microdevices and corresponding pads on the backplane, forming anchors and leaving the bonded selective set of microdevices on the backplane by separating the micro device substrate.

9 Claims, 4 Drawing Sheets

CARTRIDGE INSPECTION ANCHORS

FIELD OF THE INVENTION

The present disclosure relates to the integration of micro devices into system substrate.

BRIEF SUMMARY

According to one embodiment, there may be provided a method of integrating micro devices on a backplane comprising; forming a micro device on a first substrate, the micro device covered by a dielectric layer, forming a release layer on top of the micro device, coupling a conductive layer to a micro device contact through an opening in the dielectric layer, bonding the micro device to a second substrate through a bonding layer, removing the micro device from the first substrate, patterning the dielectric layer to form anchors to hold the micro device, removing the release layer creating a void around part of the micro device; and transferring the micro device to a system substrate.

BRIEF DESCRIPTION OF THE DRAWINGS

The foregoing and other advantages of the disclosure will become apparent upon reading the following detailed description and upon reference to the drawings.

Figure 1A:
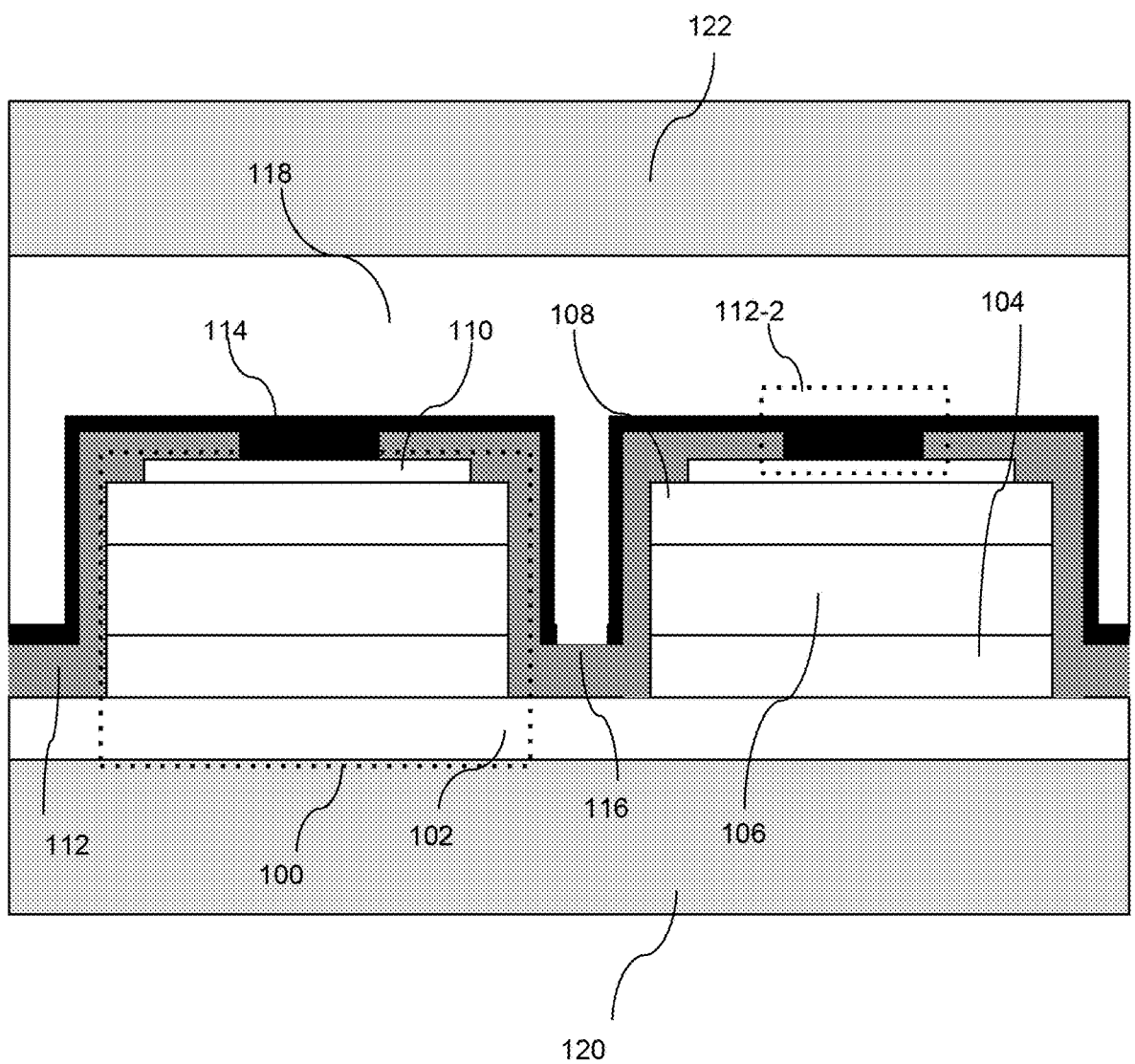
FIG. 1A shows a microdevice that may comprise of different layers.

The present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

In this description, the term "device" and "microdevice" are used interchangeably. However, it is clear to one skilled in the art that the embodiments described here are independent of the device size.

A few embodiments of this description are related to integration micro-devices into a receiving substrate. The system substrate may comprise micro light emitting diodes (LEDs), Organic LEDs, sensors, solid state devices, integrated circuits, (micro-electro-mechanical systems) MEMS, and/or other electronic components.

FIG. 1A shows a microdevice 100 that may comprise of different layers (the layers can be vertical or horizontal) such as a common unetched layer 102, a doped layer 104, an active layer 106, other doped layers 108 and a current spread layer 110. The device 100 may be formed on a substrate 120. The microdevice 100 is covered by a dielectric 112. The dielectric may have an opening 112-2 on top of the device 100 contacts. If the device has more than one contact, there can be more than one opening. A release layer can be formed on top of the microdevice before or after a conductive layer. The conductive layer 114 can be the same as the release layer. The conductive layer (and/or release layer) can have an opening 116 to provide access to the dielectric layer 112. The conductive layer 114 can be coupled to the microdevice contact through the opening in the dielectric 112-2. The microdevice is bonded to another substrate 122 using a bonding layer(s) 118. If the microdevice 100 has more than one contact, the conductive layer can be patterned to provide separate conductive traces coupled to separate microdevice contact.

Figure 1B:
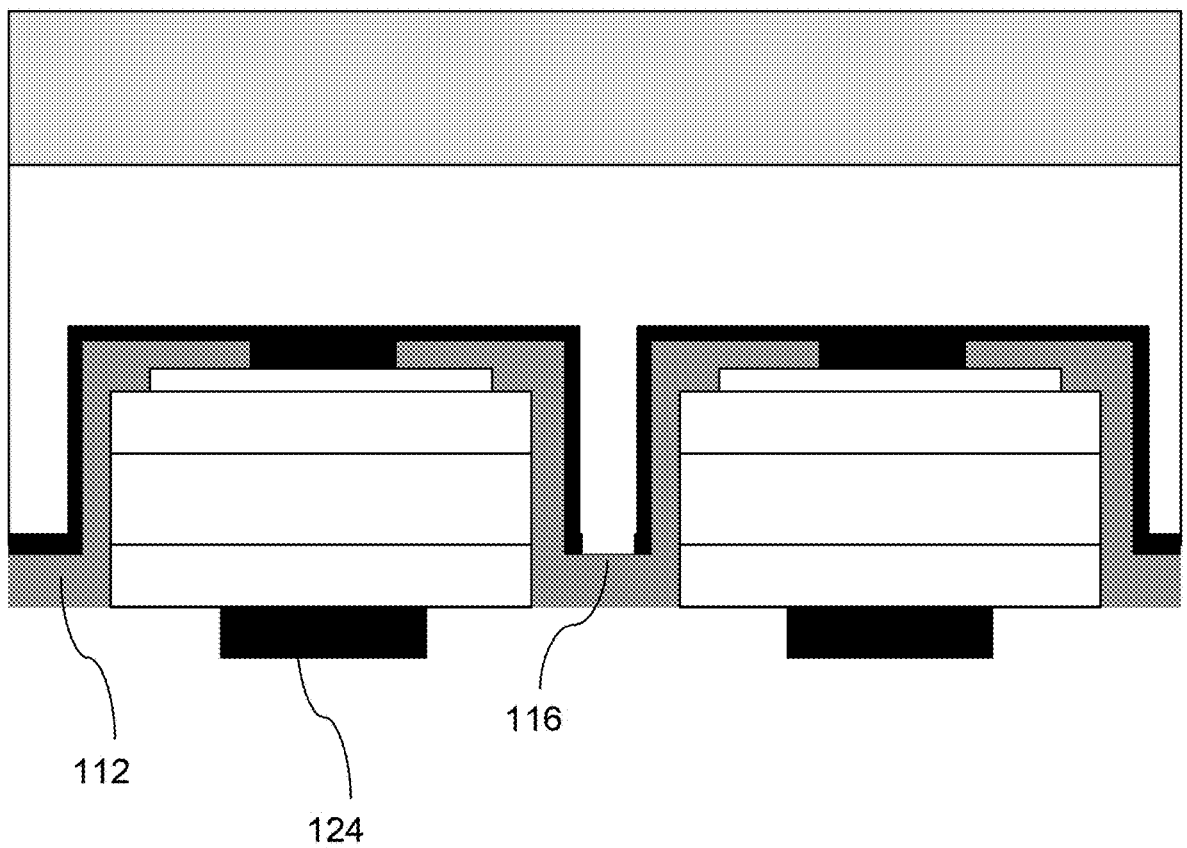
FIG. 1B shows the microdevice after the original substrate is removed.

FIG. 1B shows the microdevice 100 after the original substrate 120 is removed and the common layer 102 (if it exists) is removed. Other contacts 124 may be formed on the exposed surface of the microdevice. A layer can be formed before, after or part of the new contacts 124 connecting at least one microdevice. The new contact(s) and the conductive layer 114 test the performance or defects of the microdevice. The dielectric layer 112 can be patterned to prepare anchors holding the microdevice 100 in place.

Figure 1C:
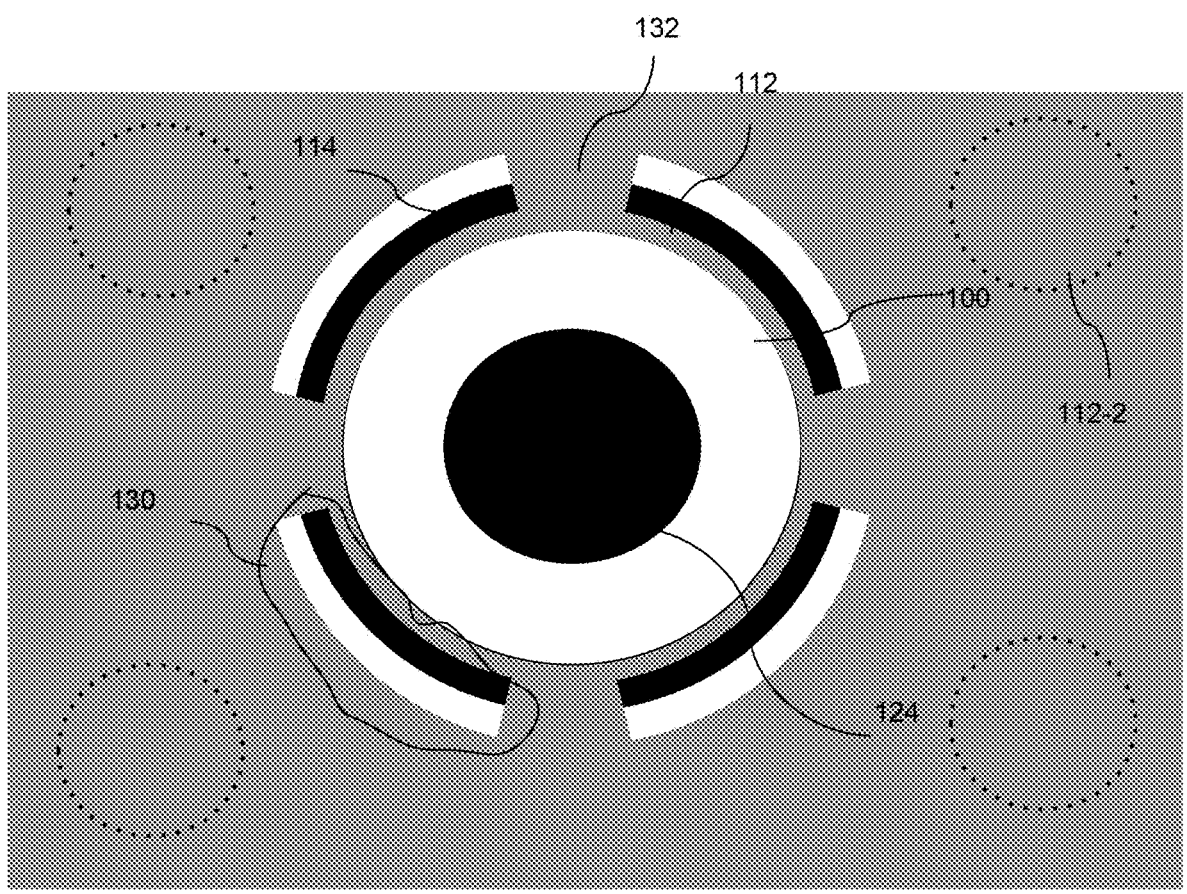
FIG. 1C shows a top view of the microdevice after the original substrate is removed.

FIG. 1C shows a top view of the microdevice 100 demonstrated in FIG. 1B. This FIGURE shows on patterning configuration. The pattern 130 in the dielectric layer forms anchors 132 that hold the device in place.

Figure 1D:
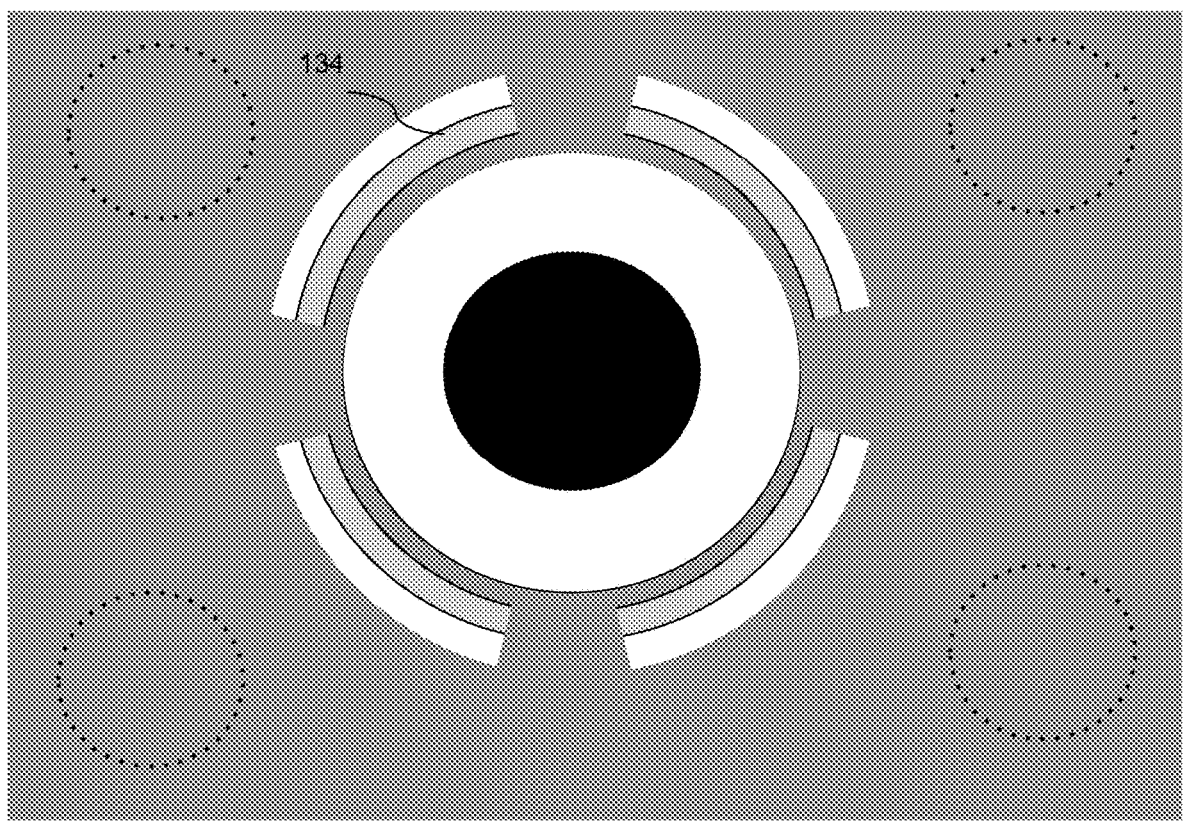
FIG. 1D shows the micro device after the release layer is removed.

FIG. 1D shows an exemplary embodiment, where the release layer is removed. The release layer can be the same as conductive layer. The removal of the release layer creates a void 134 around the microdevice.

The microdevice then can be transferred to a system substrate. The anchors will release the LED due to the transfer process.

The present invention outlines a method to transfer a microdevice, which comprise forming a micro device on a first substrate, the microdevice covered by a dielectric layer, forming a release layer on top of the microdevice, coupling a conductive layer to a microdevice contact through an opening in the dielectric layer, bonding the microdevice to a second substrate through a bonding layer, removing the microdevice from the first substrate, patterning the dielectric layer to form anchors to hold the micro device, removing the release layer creating a void around part of the microdevice, and transferring the micro device to a system substrate. The method further comprises wherein the conductive layer is the release layer. The method further comprises, wherein the microdevice has more than one contact. The method further comprise wherein the release layer is formed before or after the conductive layer. The method further comprises, wherein the dielectric layer has more than one openings on top of the microdevice contacts. The method further comprises, wherein the conductive layer has an opening to access the dielectric layer. The method further comprises, wherein the microdevice comprises of different layers such as a common unetched layer, a doped layer, an active layer, other doped layers, a current spread layer, and wherein further the different layers can be vertical or horizontal. The method further comprises, wherein additional contacts are formed on an exposed surface of the micro device once the first substrate is removed and wherein further wherein the additional contacts and the conductive layer test a performance and defects of the microdevice.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

The invention claimed is:

1. A method to transfer a microdevice, the method comprising:
   forming a micro device on a first substrate, the microdevice covered by a dielectric layer;
   forming a release layer on top of the microdevice;
   coupling a conductive layer to a microdevice contact through an opening in the dielectric layer;
   bonding the microdevice to a second substrate through a bonding layer;
   removing the microdevice from the first substrate;
   patterning the dielectric layer to form anchors to hold the micro device;
   removing the release layer creating a void only around part of the microdevice; and
   transferring the micro device to a system substrate.

2. The method of claim 1, wherein the conductive layer is the release layer.

3. The method of claim 1, wherein the microdevice has more than one contact.

4. The method of claim 1, wherein the release layer is formed before or after the conductive layer.

5. The method of claim 1, wherein the conductive layer has an opening to access the dielectric layer.

6. The method of claim 1, wherein the microdevice comprises of different layers such as a common unetched layer, a doped layer, an active layer, other doped layers, and a current spread layer.

7. The method of claim 6, wherein the different layers can be vertical or horizontal.

8. The method of claim 1, wherein additional contacts are formed on an exposed surface of the micro device once the first substrate is removed.

9. The method of claim 8, wherein the additional contacts and the conductive layer test a performance and defects of the microdevice.

* * * * *